United States Patent
Elian et al.

(10) Patent No.: US 6,171,755 B1
(45) Date of Patent: Jan. 9, 2001

(54) CHEMICALLY AMPLIFIED RESIST

(75) Inventors: Klaus Elian, Erlangen (DE); Ewald Günther, Chempaka Court (SG); Rainer Leuschner, Grossenseebach (DE)

(73) Assignee: Infineon Technologies AG, Munich (DE)

( * ) Notice: Under 35 U.S.C. 154(b), the term of this patent shall be extended for 0 days.

(21) Appl. No.: 09/201,728

(22) Filed: Nov. 30, 1998

(30) Foreign Application Priority Data

Nov. 28, 1997 (DE) .............................................. 197 52 941

(51) Int. Cl.[7] ...................................................... G03F 7/004
(52) U.S. Cl. ........................ 430/270.1; 430/296; 430/926
(58) Field of Search ................................. 430/296, 270.1, 430/926

(56) References Cited

U.S. PATENT DOCUMENTS

| | | | |
|---|---|---|---|
| 5,164,278 | * 11/1992 | Brunsvold et al. .................. | 430/176 |
| 5,863,701 | * 1/1999 | Mertesdorf ......................... | 430/270.1 |

FOREIGN PATENT DOCUMENTS

| | | |
|---|---|---|
| 0 440 375 A1 | 8/1991 | (EP) . |
| 0 701 171 A1 | 3/1996 | (EP) . |
| 0 708 368 A1 | 4/1996 | (EP) . |
| 0 492 256 B1 | 8/1996 | (EP) . |
| 0 742 488 A2 | 11/1996 | (EP) . |
| 0 848 288 A1 | 6/1998 | (EP) . |
| 0 874 281 A1 | 10/1998 | (EP) . |

OTHER PUBLICATIONS

Published International Patent Application WO 96/08751 (Sezi et al.), dated Mar. 21, 1996.
Hiroshi Ito, Deep–UV rsists: Evolution and status:, Solid State Technology, Jul. 1996, pp. 164–173.
S.A. MacDonald et al., "Airborne Chemical Contamination of a Chemically Amplified Resist", SPIE, vol. 1466 Advances in resist Technology and processing VIII (1991), pp. 2–12.
Satoshi Saito, "High Performance Chemically Amplified Positive Electron–Beam Resist: Optimization of Base Additives for Environmental Stabilization", J. Photopolym. Sci. Technol., vol. 9, No. 4, 1996, pp. 677–684.
G. Wallraff, "Thermal and acid–catalyzed deprotection kinetics in candidate deep ultraviolet resist materials", J. Vac. Sci. Technol. B 12(6), Nov./Dec. 1994, pp. 3857–3862.
James V. Criello, et al., "Chemically Amplified Electron–Beam Photoresists", Chem. Mater. 1996, 8, 376–381.
R. Leuschner et al., "Bilayer Resist Based on Wet Sylilation (Carl Process)", MNE '94, Intern. Conf. On Micro– and Nano–Engineering 94, Davos, Switzerland, contribution: P23.
Hideo Hiribe et al., "Relationship between Dissolution Inhibitors and Dissolution Rate of Resist in Chemically amplified Three–Component Positive Resist", Jpn. J. Appl. Phys., vol. 34, 1995, pp. 4247–4252.

* cited by examiner

*Primary Examiner*—Janet Baxter
*Assistant Examiner*—Rosemary Ashton
(74) *Attorney, Agent, or Firm*—Herbert L. Lerner; Laurence A. Greenberg; Werner H. Stemer

(57) ABSTRACT

A chemically amplified resist for electron beam lithography contains the following components:

- a polymer with dissolution-inhibiting groups that can be cleaved with acid catalysis,
- a photo-reactive compound, which upon electron irradiation releases a sulfonic acid with a $pK_a$ value $\leq 2.5$ (photo acid generator),
- an electron-beam-sensitive sensitizer enhancing the exposure sensitivity of the resist, such as a fluorene derivative, and
- a solvent.

18 Claims, No Drawings

CHEMICALLY AMPLIFIED RESIST

BACKGROUND OF THE INVENTION

Field of the Invention

The invention relates to a chemically amplified resist for electron beam lithography.

In microelectronics, so-called chemically amplified resists are widely used for optical lithography and electron beam writing (electron beam lithography) (see Solid State Technology, Vol. 39 (1996), No. 7, pp. 164–173). The chemical amplification is used both with wet-developable single-layer resists and in entirely or partly dry-developable resists. The resists may operate on the principle of acid-catalyzed cleavage; polar but blocked chemical groups, such as carboxyl groups or phenolic hydroxyl groups, are deblocked by a photolytically generated acid, and the resist changes its polarity in the exposed regions. This change in polarity can be utilized for instance for developing the resist in an alkaline developer, or—in dry-developable resists—for selective silylation. Examples of blocking groups are tert-butylester and tert-butyloxycarbonyloxy groups.

European Patent Specification EP 0 492 256 B1 discloses photolithographic structure generation in which a dry-developable resist after exposure is subjected to a temperature treatment (post exposure bake=PEB), then silylated from the liquid phase, and after that anisotropically etched in oxygen plasma or dry-developed. Depending on the type of silylating solution, either positive or negative structures (images) are created. The resist in general comprises at least two solid components, that is, a base polymer and a photo-active acid generator. The base polymer contains carboxylic acid anhydride and tert-butylester partial structures; the acid generator is preferably an onium compound, such as diphenyliodonium and triphenylsulfonium trifluoromethane-sulfonate. Such a resist is especially suitable for photostructuring in the submicron and sub-half-micron range with very steep edges.

In creating structures as described above—as in other resist systems that operate on the principle of acid-catalyzed cleavage—the so-called delay time effect has been found. This effect is expressed, for instance in electron beam lithography, in a deviation of the desired structural dimension from the structure actually obtained after the development, if there are delays (post exposure delay=PED) between the electron beam lithography and the temperature treatment (PEB). The longer this delay is, the greater are the structural deviations. In resists of the above type containing anhydride groups, for instance, the tolerable length of time is about 5 to 10 minutes. However, such a short time period is unacceptable for technical production reasons.

The delay time problems described are well known and are ascribed to basic contaminations in the air, which deactivate the photochemically generated strong acid during the delay. It has therefore already been proposed that this problem be solved by filtration of the air using activated charcoal (see Proceedings SPIE, Vol. 1466 (1991), pp. 2–12). However, this entails major investment cost.

Even by other measures, decisively influencing the delay time effect is not possible:

By adding organic amines to the resist, using triphenylsulfonium trifluoromethane sulfonate as sensitive photo acid generators (PAG), the resist can indeed be stabilized against lateral acid diffusion phenomena, but—because of this base addition—highly sensitive resists cannot be realized in this way (Journal of Photopolymer Science and Technology, Vol. 9 (1996), No. 4, pp. 677–684).

By using photo acid generators with sterically small residues of strong acids, such as trifluoromethane sulfonate residues, the required exposure sensitivity can indeed be achieved, but the photo acid generators can diffuse very easily in the solid resist, and—because of the high acid strength—are very delay—sensitive to bases (Journal of Vacuum Science and Technology B, Vol. 12 (1994), No. 6, pp. 3857–3862).

By adding mono- or dicarboxylic acids in the form of monomers or short-chained polymers, which are protected in the form of tert-butylesters, to the resist further dissolution inhibitors are introduced, and systems of high sensitivity are thereby obtained. However, structural dimensions of only 0.5 $\mu$m can be realized in this way (Chemistry of Materials, Vol. 8 (1996), No. 2, pp. 376–381).

Indeed, the delay time behavior of resists can in principle be improved by the choice of a suitable photo acid generator, diphenyliodonium tosylate instead of the corresponding trifluoromethane sulfonate, but then the sensitivity drops (MNE-94- International Conference on Micro- and Nano-Engineering 94, Davos, Switzerland, Sep. 26–29, 1994, Paper P23). However, in electron beam lithography, this then requires longer writing times, which is undesired in production.

SUMMARY OF THE INVENTION

The object of the invention is to disclose a chemically amplified resist suitable for electron beam lithography that has an improved delay time behavior—in comparison with known resists—and at the same time has an exposure sensitivity less than 10 $\mu$C/cm$^2$, in particular less than or equal to 1 $\mu$C/cm$^2$, at high resolution, and in particular at a resolution of $\leq$0.25 $\mu$m.

According to the invention, this is attained in that the resist contains the following components:

a polymer with dissolution-inhibiting groups that can be cleaved with acid catalysis, a photo-reactive compound, which upon electron irradiation releases a sulfonic acid with a pK$_a$ value $\leq$2.5 (photo acid generator), an electron-beam-sensitive sensitizer enhancing the exposure sensitivity of the resist, and a solvent.

The chemically amplified resist of the invention is a dry-developable positive resist that lends itself well to production in quantity. The object of the invention is attained by the following provisions.

DESCRIPTION OF PREFERRED EMBODIMENTS

The resist, for instance on the basis of methacrylic acid tert-butylester/maleic anhydride (in the form of polymer) has a photo acid generator in the form of a photo-active compound, from which in the electron irradiation a relatively weak sulfonic acid (pK$_a$$\leq$2.5) is released; the pK$_a$ value is the so-called acid exponent (negative decadlic logarithm of the acid constant K$_a$). Such acids are for instance benzenesulfonic acid (pK$_a$=0.70) and toluene-sulfonic acid (pK$_a$=1.55). The relatively weak sulfonic acid has the advantage that it is relatively insensitive to basic contaminants, and that the vapor pressure and mobility are markedly less than in the otherwise often-used trifluoromethanesulfonic acid having a pK$_a$ value of −5.9 (see Japanese Journal of Applied Physics, Vol. 34 (1995), Part 1, No. 8A, pp. 4247–4252).

As the photo acid generator, which preferably has a $pK_a$ value of $\geq -1$, the following photoactive compounds are advantageously used: diphenyliodonium salts and triphenylsulfonium salts (of sulfonic acids) as well as bis-benzenesulfones and N-sulfonyloxymaleimides, -phthalimides, and -naphthalimides, that is, esters of sulfonic acids with hydroxyimides. The sulfonic acids on which the photo acid generator is based may be either aromatic such as benzenesulfonic acid and benzenesulfonic acid substituted with alkyl groups and/or halogens, or aliphatic such as propanesulfonic and cyclohexanesulfonic acid. The N-sulfonyloxymaleimides can also be incorporated into the polymer, which prevents a possible demixing of the polymer and the photo acid generator. Diazodisulfones can also be used as photo acid generators.

If the photo acid generators have aromatic partial structures, then both the acid strength and the polarity as well as steric effects can be adjusted in a purposeful way by varying substituents in the aromatic compounds. Such compounds are for instance the esters of N-hydroxyphthalimide with p-toluenesulfonic acid, p-fluorobenzenesulfonic acid, and p-iodobenzenesulfonic acid.

By means of the weak sulfonic acid, the delay time behavior of the resist according to the invention is improved decisively. To attain high sensitivity, this resist contains—along with the photoactive compound that generates the sulfonic acid—an electron-beam-sensitive sensitizer. This sensitizer absorbs some of the energy of the electron radiation and then gives up the absorbed energy to the photo acid generator.

The sensitizer preferably has the following structure:

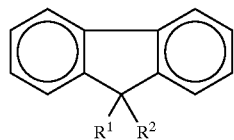

in which $R^1$=OH or OR; $R^2$=COOH or COOR, where R=$C_1$ to $C_5$ alkyl;

The radicals $R^1$ and $R^2$ of the sensitizer, which is a fluorene derivative can have the same or a different alkyl radical R; the alkyl radical may be branched or unbranched. The radical $R^1$ is preferably a hydroxyl group and the radical $R^2$ is preferably a carboxyl group. Especially preferably, the sensitizer is 9-hydroxy-9-fluorene carboxylic acid.

The sensitizer effect, which was previously known only from exposures in the UV range, has been achieved—according to the invention—for the first time in electron beam lithography by means of the use of fluorene derivatives. This effect is suspected, without wishing to be bound by any theory, to be based on a combined electron—proton transfer mechanism from the sensitizer to the photo acid generator. The sensitizing process increases the effective quantum yield from cleaving the photo acid generator. As a result—for the same electron irradiation dose (equals writing time) and the same starting content of photo acid generator in the resist—more acid catalyst for cleaving the dissolution-inhibiting groups of the polymer is formed. In this way, the exposure sensitivity of the resist increases, without having to increase the actual catalyst strength resulting in an increase of the delay time sensitivity of the resist. In comparison with an unsensitized resist system, a sensitized system has an exposure sensitivity that is greater by up to a factor of 6, depending on the resist composition.

Because of the above-described new possibility of sensitization, all the advantages of sensitizing mechanisms known until now only for optical lithography can be utilized for electron beam lithography. This includes above all a lesser dependency of the exposure sensitivity on the choice of photo acid generator. It is therefore now possible first—without taking the requisite exposure sensitivity into account —to choose a photo acid generator suitable from the standpoint of delay time behavior. The required exposure sensitivity is then adjusted afterward by adding variable quantities of sensitizer. By means of the sensitizer, there are accordingly more possibilities in choosing suitable photo acid generators. The mass ratio of photo acid generator to sensitizer, in the resist of the invention, is generally approximately 0.5:1.5 to 1.5:0.5; advantageously, this ratio is 0.5:1 to 1.5:1 and preferably approximately 1:1.

Since the sensitizer addition has a direct influence only on the photo acid generator but not on the polymer, in the resist according to the invention in general polymers can be used that have dissolution-inhibiting groups that can be cleaved by acid catalysis. Such groups are preferably tert-butylester and tert- butyloxycarbonyloxy groups. Other possible groups are for instance tetrahydrofuranyl and tetrahydropyranyl groups, as well as N,O-acetal groups in the polymer chain. In the polymers, the tert-butylester groups are preferably based on acrylic acid tert-butylester, methacrylic acid tert-butylester, vinylbenzoic acid tert-butylester, or cinnamic acid tert-butylester, while the tert-butyloxycarbonyloxy groups are preferably based on tert-butyloxycarbonyloxystyrene or tert-butyloxycarbonyloxymaleimide.

Copolymers can also be used in the resist of the invention. The copolymers can—along with the cleavable groups—advantageously have carboxylic acid anhydride groups. Polymers whose anhydride groups are derived from maleic anhydride are preferred; another such compound is itaconic anhydride. Suitable copolymers are for instance copolymers of maleic anhydride and acrylic acid tert-butylester, methacrylic acid tert-butylester, or vinylbenzoic acid tert-butylester. Terpolymers prove to be especially advantageous. These are for instance polymers of methacrylic acid tert-butylester, maleic anhydride, and methacrylic acid or trimethylallylsilane. Such polymers may also contain a further component, so that for instance a quaterpolymer of methacrylic acid tert-butylester, maleic anhydride, trimethylallylsilane, and methacrylic acid ethoxyethylester can be used.

As solvents, resist solvents known per se are used. Preferably, the solvent is methoxypropylacetate or a mixture of gamma- butyrolactone and cyclohexanone, in particular in a volumetric ratio of approximately 1:2. Other suitable solvents are for instance cyclopentanone and cyclohexanone or ethylene glycol ethers or diethylene glycol ethers, optionally mixed with dibenzyl ether.

The resist according to the invention can be used in both single-layer and two-layer processes; its use as a two-layer resist is preferred. The resist in general has the following composition: 5 to 9 mass percent polymer, 0.1 to 1 mass percent photo acid generator, 0.1 to 1 mass percent sensitizer, and 85 to 94 mass percent solvent; the various components add up to 100%. In use as a single-layer resist, the composition is generally as follows: 9 to 18 mass percent polymer, 1 to 2 mass percent photo acid generator, 1 to 2 mass percent sensitizer, and 78 to 89 mass percent solvent; that is, the solid content is higher.

If the resist according to the invention is used as a single-layer resist, the structuring is done in such a way that a resist layer is applied to a substrate. This resist layer is dried and irradiated with electrons. The electron-beamexposed layer is then subjected to a temperature treatment (PEB) for a certain length of time, and after that wet development takes place (in this respect, see for instance International Patent Application Wo 96/08751).

In structure generation with a two-layer resist, a bottom resist is first applied to the substrate, and to that a layer of the resist according to the invention is applied as a top resist. The resist layer is then dried and irradiated with electrons. The electron-beam-exposed layer is subjected to a temperature treatment (PEB) for a certain length of time and then wet-developed. It is next silylated, and the bottom resist is dry-developed in an anisotropic oxygen plasma (see for instance WO 96/08751).

The irradiation is effected in general with electrons with an acceleration voltage in the range from 0.5 to 100 kV. An acceleration voltage (in electron beam lithography) in the range between approximately 15 and 50 kV is preferred.

The temperature treatment (PEB) is done in each case in the range between 50 and 200° C., preferably in the range approximately between 80 and 150° C. The duration of the temperature treatment is generally 5 to 300 s, preferably about 15 to 180 s.

DESCRIPTION OF EXEMPLARY EMBODIMENTS

The invention will now be described in further detail in terms of exemplary embodiments (PBW stands for parts by weight).

Example 1

A resist with the following composition is used: 8 PBW of a terpolymer of methacrylic acid tert-butylester, maleic anhydride and methacrylic acid with a molecular weight of approximately 3000 g/mol (produced by radical polymerization), 1 PBW of the ester of N-hydroxyphthalimide with p-toluenesulfonic acid (as a photo acid generator), 1 PBW of 9-hydroxy-9-fluorenecarboxylic acid (as a sensitizer), and 90 PBW of 1-methoxy-2- propylacetate (as the solvent). The resist is spun onto a silicon wafer (speed of rotation: 3000 rpm, duration: 20 s), which is provided with a bottom resist in the form of a baked Novolak film 0.5 $\mu$m thick (220° C. for 45 minutes in the forced-air oven); it is then dried on a hot plate (120° C. for 60 s). The film thickness of the top resist thus obtained is approximately 250 nm. Next, by means of an electron beam writer (HL 700 made by Hitachi) at an acceleration voltage of approximately 30 kV, the resist is irradiated with electrons and then baked (PEB) on a hot plate for 120 s at approximately 130° C. The tert-butyl ester groups are cleaved in the process, catalyzed by the photolytically generated acid. By development (30 s, Puddle system made by Hamatec) with an aqueous-alkaline developer (NMD-W 1.19% made by Tokyo Ohka, with addition of 1% methylbenzylamine), the written structure is obtained.

By means of electron beam lithography, various regions can be irradiated directly with different doses, and the Dp(O) dose can thus be determined. The Dp(O) dose ascertained in this way, namely <1 $\mu$C/cm$^2$, is still below the minimum possible writing dose for the electron beam writer.

To transfer the structure to the substrate, the top resist—after wet development—is treated for 40 s with a silylation solution, which contains 2% of a diaminopropyldimethyl siloxane oligomer, 25% ethanol, 70% isopropanol, and 3% water. It is then dry etched for 50 s in an oxygen plasma (900 W, 30 sccm O$_2$).

In studies of delay time behavior, it is found that a delay of 24 h between the electron irradiation and the temperature treatment (PEB) requires increasing the necessary radiation dose for thorough development by only about 50%.

For comparison, a resist was tested with the following composition, containing no sensitizer: 9 PBW of the aforementioned terpolymer, 1 PBW of mono-4-tert-butyldiphenyliodonium-2H-hexafluoropropylsulfonate (as the photo acid generator) and 90 PBW of 1-methoxy-2-propylacetate (as the solvent); the hexafluoropropane sulfonic acid on which the photo acid generator is based has a pK$_a$ value comparable to that of the trifluoromethane sulfonic acid, that is, −5.9. In this resist, which has an irradiation sensitivity of 1.6 $\mu$C/cm$^2$ the requisite radiation dose for a delay of 24 h (between the electron irradiation and the temperature treatment) rises by over 200%.

From the comparison tests, the following findings are made: When a photo acid generator based on a relatively weak sulfonic acid is used in combination with a special sensitizer (based on fluorene), the delay time behavior can be improved considerably; that is, the negative effects of relatively long delays are markedly reduced.

Example 2

A resist with the following composition is used: 8 PBW of a terpolymer of methacrylic acid tert:-butylester, maleic anhydride and methacrylic acid with a molecular weight of approximately 3000 g/mol (produced by radical polymerization), 1 PBW of the ester of N-hydroxyphthalimide with p-fluorobenzenesulfonic acid (as a photo acid generator), 1 PBW of 9-hydroxy-9-fluorene carboxylic acid (as a sensitizer), and 90 PBW of 1-methoxy-2-propylacetate (as the solvent). The resist is spun onto a silicon wafer (speed of rotation: 2000 rpm, duration: 20 s), which is provided with a bottom resist in the form of a baked Novolak film 1.3 $\mu$m thick (220° C. for 45 minutes in the forced-air oven); it is then dried on a hot plate (120° C. for 60 s). The film thickness of the top resist thus obtained is approximately 320 nm. Next, by means of an electron beam writer (combination of the 840A scanning electron microscope made by Jeol and the Nanobeam electron beam writer made by Sietec) at an acceleration voltage of approximately 30 kV, the resist is irradiated with electrons and then baked (PEB) on a hot plate for 120 s at approximately 110° C. The tert-butyl ester groups are cleaved in the process, catalyzed by the photolytically generated acid. By development (30 s, coater made by Convac) with an aqueous-alkaline developer (NMD-W 1.19% made by Tokyo Ohka, with addition of 1% methylbenzylamine), the written structure is obtained.

By means of electron beam lithography, ten identical line and space patterns (1:1) with staggered dosage are inscribed. From plotting the line widths in the individual structure pattern, the widths being measured after development, together with the corresponding writing dose, the Dp(O) dose of the resist can be ascertained: <<3 $\mu$C/cm$^2$. At the minimum possible industrial writing dose of the electron beam writer (Nanobeam), which is 3 $\mu$C/cm$^2$, the resist was severely overexposed. It can be determined from this that the exposure sensitivity of the resist is markedly below 3 $\mu$C/cm$^2$.

To transfer the structure to the substrate, the top resist—after the wet development—is treated for 60 s with a silylation solution, which contains 2% of a diaminopropyldimethyl siloxane oligomer, 25% ethanol, 70% isopropanol, and 3% water. It is then dry etched for 60 s in an oxygen plasma (900 W, 30 sccm O$_2$).

Example 3

A resist with the following composition is used: 6.4 PBW of a quaterpolymer of methacrylic acid tert-butyl ester, maleic anhydride, trimethylallylsilane and methacrylic acid ethoxyethyl ester (produced by radical polymerization), 0.8 PBW of the ester of N-hydroxyphthalimide with p-iodobenzenesulfonic acid (as a photo acid generator), 0.8 PBW of 9-hydroxy-9-fluorenecarboxylic acid (as a sensitizer), and 92 PBW of 1-methoxy-2-propylacetate (as the solvent). The resist is spun onto a silicon wafer (speed of rotation: 3000 rpm, duration: 20 s), which is provided with a bottom resist in the form of a baked Novolak film 0.5 μm thick (220° C. for 45 minutes in the forced-air oven); it is then dried on a hot plate (140° C. for 60 s). The film thickness of the top resist thus obtained is approximately 190 nm. Next, by means of an electron beam writer (HL 700 made by Hitachi) at an acceleration voltage of approximately 30 kV, the resist is irradiated with electrons and then baked (PEB) on a hot plate for 120 s at approximately 110° C. The tert-butyl ester groups are cleaved in the process, catalyzed by the photolytically generated acid. By development (60 s, Puddle system made by Hamatec) with an aqueous-alkaline developer (NMD-W 1.19% made by Tokyo Ohka, with addition of 1% methylbenzylamine), the written structure is obtained. After the wet development, the top resist is treated twice, for 65 s each, with a silylation solution in the form of a 0.75% solution of a diaminopropyldimethyl siloxane oligomer in a mixture of isopropanol and water (volumetric ratio 5:1). It is then dry etched for 60 s in an oxygen plasma (900 W, 30 sccm $O_2$). Proceeding in this way produces very good line and space test structures with a dimension of 0.15 μm—at an irradiation dose of 0.9 μC/cm².

We claim:

1. A chemically amplified resist for electron beam lithography, containing
    a polymer with dissolution-inhibiting groups that can be cleaved with acid catalysis,
    a photoreactive compound, which upon electron irradiation releases a sulfonic acid with a $pK_a$ value $\leq 2.5$ (photo acid generator),
    an electron-beam-sensitive sensitizer enhancing the exposure sensitivity of the resist, the sensitizer having the structure

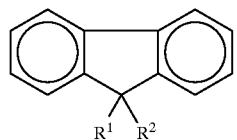

in which $R^1$=OH or OR, $R^2$=COOR where R=$C_1$ to $C_5$ alkyl; and
    a solvent.

2. The resist of claim 1, in which the polymer has tert-butyl ester or tert-butyloxycarbonyloxy groups.

3. The resist of claim 2 in which the polymer is a terpolymer of t-butyl methacrylate, maleic anhydride and methacrylic acid.

4. The resist of claim 2 in which the polymer is a quaterpolymer of t-butyl methacrylate, maleic anydride, trimethylallylsilane, and 2-ethoxyethyl methacrylate.

5. The resist of claim 1 in which the sulfonic acid has a $pK_a$ value $\geq -1$.

6. The resist of claim 1 in which the photo acid generator is a diphenyliodonium salt, a triphenyl sulfonium salt, a bis-benzene disulfone, an N-sulfonyloxymaleimide, an N-sulfonyloxyphthalimide, or an N-sulfonyloxynaphthalimide.

7. The resist of claim 6 in which the photo acid generator is N-p-toluenesulfonyloxyphthalimide.

8. The resist of claim 6 in which the photo acid generator is N-p-fluorobenzenesulfonyloxyphthalimide.

9. The resist of claim 6 in which the photo acid generator is N-p-iodobenzenesulfonyloxyphthalimide.

10. The resist of claim 1 in which the sensitizer is 9-hydroxy-9-fluorene carboxylic acid.

11. The resist of claim 1 in which the mass ratio of photo acid generator to sensitizer is 0.5:1 to 1.5:1.

12. The resist of claim 1 in which the solvent is methoxypropylacetate or a mixture of γ-butyrolactone and cyclohexanone.

13. The resist of claim 1 which is a two layer resist including a top layer having the composition 5 to 9 mass percent polymer, 0.1 to 1 mass percent photo acid generator, 0.1 to 1 mass percent sensitizer, and 85 to 94 mass percent solvent, the various components adding up to 100%.

14. The resist of claim 1 which is a single layer resist having the following composition: 9 to 18 mass percent polymer, 1 to 2 mass percent photo acid generator, 1 to 2 mass percent sensitizer, and 78 to 89 mass percent solvent, the various components adding up to 100%.

15. A process for preparing a chemically amplified resist for electron beam lithography,
    in which a substrate, which can be precoated with a bottom resist, is coated with a chemically amplified resist according to claim 1, dried, irradiated with an electron beam, and subjected to temperature treatment (PEB) and wet development followed by silylation and dry development of bottom resist when present.

16. A process according to claim 15 in which the substrate is a silicon wafer.

17. A process according to claim 15 in which the acceleration voltage of the irradiation is in the range from 0.5 to 100 kV.

18. A process according to claim 15 in which temperature treatment (PEB) is in the range from 50 to 200° C. for a period of 5 to 300 seconds.

* * * * *